United States Patent [19]

Yamazaki et al.

[11] Patent Number: 4,874,920
[45] Date of Patent: Oct. 17, 1989

[54] ELECTRONIC DEVICE MANUFACTURING METHODS

[75] Inventors: Shunpei Yamazaki; Kenji Itoh; Susumu Nagayama, all of Tokyo, Japan

[73] Assignee: Semiconductor Energy Laboratory Co., Ltd., Kanagawa, Japan

[21] Appl. No.: 298,263

[22] Filed: Jan. 13, 1989

Related U.S. Application Data

[60] Continuation of Ser. No. 62,596, Jun. 16, 1987, abandoned, which is a division of Ser. No. 740,764, Jun. 3, 1985, Pat. No. 4,713,518.

[30] Foreign Application Priority Data

Jun. 8, 1984 [JP] Japan .................................. 59-117538
Oct. 8, 1984 [JP] Japan .................................. 59-211769

[51] Int. Cl.$^4$ ............................................. B23K 26/00
[52] U.S. Cl. .......................... 219/121.85; 219/121.69; 219/121.75; 156/643; 427/53.1
[58] Field of Search ........... 219/121.6, 121.67, 121.68, 219/121.69, 121.73, 121.75, 121.85; 156/643, 646; 29/569.1, 591, 580–583; 427/74, 53.1

[56] References Cited

U.S. PATENT DOCUMENTS

| | | | |
|---|---|---|---|
| 4,069,080 | 1/1978 | Osborne | 219/121 LR |
| 4,424,435 | 1/1984 | Barnes Sr. | 219/121 LR |
| 4,478,677 | 10/1984 | Chen et al. | 219/121 LS |
| 4,631,801 | 12/1986 | Yamazaki | 219/121 LJ |
| 4,667,058 | 5/1987 | Catalano et al. | 219/121 LJ |
| 4,703,166 | 10/1987 | Bruning | 219/121 LR |

FOREIGN PATENT DOCUMENTS 0046892 3/1985 Japan ........................... 219/121 LR Primary Examiner—M. H. Paschall
Attorney, Agent, or Firm—Gerald J. Ferguson, Jr.

[57] ABSTRACT

In a method of making an electronic device having at least a transparent conductive layer, which includes at least a step of forming a transparent conductive layer member and a step of forming a transparent conductive layer by patterning the transparent conductive layer member using a spot-shaped or linear laser beam or beams, each of which has a short wavelength of 400 nm or less and optical energy greater than the optical energy band gap of the transparent conductive layer.

9 Claims, 4 Drawing Sheets

ELECTRONIC DEVICE MANUFACTURING METHODS

This application is a continuation of Ser. No. 062,596, filed 6/16/87, now abandoned which is a division of Ser. No. 740,764, filed 6/3/85 now U.S. Pat. No. 4,713,518.

BACKGROUND OF THE INVENTION

1. Field of the Invention

The present invention relates to a method for the manufacture of an electronic device which has at least a transparent conductive layer, such as a semiconductor photoelectric conversion device, field effect transistor, liquid crystal display or the like, and more particularly to improvement in an electronic device manufacturing method which includes at least a step of forming a transparent conductive layer member and a step of patterning the transparent conductive layer member by one or more laser beams into the transparent conductive layer.

2. Description of the Prior Art

Heretofore there has been proposed an electronic device manufacturing method which includes at least a step of forming a transparent conductive layer member and a step of patterning the transparent conductive layer member by means of a laser beam to form a transparent conductive layer. Compared with another manufacturing method which employs a photolithography technique for the formation of such a layer, the abovesaid method excels in that the transparent conductive layer can be formed without any defects. The reason for this is that in the case of forming the transparent conductive layer by photolithography, a photoresist mask therefor is prone to pinholing or exfoliation at its marginal edges, which results in the formation of defects, whereas the method utilizing the patterning process using a laser beam has no such factors which cause defects.

With the conventional method employing the patterning technique for the formation of the transparent conductive layer through use of a laser beam, it is a general practice to use a YAG laser which emits a laser beam having a relatively long wavelength of about 1060 nm.

The absorption coefficient of the abovesaid the transparent conductive layer member for the laser beam of such a relatively long wavelength is extremely small. For example, when the transparent conductive layer member consists principally of a sublimable metallic oxide such as $SnO_2$, $In_2O_3$ or ITO (Indium-Tin Oxide), its absorption coefficient is $10^2$/cm or less. The reason for this is as follows: In the case where the laser beam has a wavelength as large as 1060 nm, its optical energy is smaller than the optical energy band gap of the transparent conductive layer member. For instance, in the case of the laser beam having the wavelength of 1060 nm, its optical energy is about 1.23 eV. On the other hand, when the transparent conductive layer member consists principally of such a sublimable metallic oxide as $SnO_2$, $In_2O_3$ or ITO, its optical energy band gap is in the range of 3 to 4 eV.

For the patterning of the transparent conductive layer member by the laser beam, it is necessary that the beam be high-powered, since the absorption coefficient of the transparent conductive layer member for the laser beam is extremely small. When the transparent conductive layer member is as thin as 2 μm or less, it is feared that a substrate and other layers underlying it is damaged or patterned. Also it is feared that the marginal edges of the transparent conductive layer are swollen or exfoliated.

Furthermore, in the case of the laser beam having such a relatively long wavelength of 1060 nm or so, it is difficult to reduce its minimum spot diameter to a small value of 100 μm or less. Therefore, it is difficult, with the conventional manufacturing method, to finely form the transparent conductive layer with high precision. In addition, in the case of simultaneously forming a plurality of transparent conductive layers, they cannot be spaced apart a small distance of 100 μm or less. This imposes severe limitations on the fabrication of a small and compact electronic device having the transparent conductive layer.

SUMMARY OF THE INVENTION

It is therefore an object of the present invention to provide a novel method for the manufacture of an electronic device having at least a transparent conductive layer which is free from the abovesaid defects of the prior art.

The electronic device manufacturing method of the present invention includes at least a step of forming a transparent conductive layer member and a step of scanning the transparent conductive layer member by a spot-shaped laser beam or exposing the transparent conductive layer member to irradiation by one or more linear laser beams, thereby forming the transparent conductive layer. In this case, the laser beam has a wavelength of 400 nm or less which is smaller than in the past and has an optical energy greater than the optical energy band gap of the transparent conductive layer member.

With the use of the laser beam having such a short wavelength equal to or less than 400 nm, the absorption coefficient of the transparent conductive layer member for the laser beam is far larger than the absorption coefficient for the laser beam having the long wavelength of about 1060 nm. For example, the absorption coefficient of the transparent conductive layer member is $10^4$/cm or more, which is more than 100 times larger than the absorption coefficient (approximately $10^2$/cm) for the laser beam of the 1060 nm or so wavelength used in the past. Therefore, the laser beam need not be high-powered. Further, even if the transparent conductive layer member to be patterned is as thin as 2 μm or less, there is no possibility of damaging or patterning the underlying substrate or layer by the laser beam. Further, the method of the present invention is free from the fear of swelling or exfoliating the marginal edges of the transparent conductive layer as a result, of the patterning thereof.

Moreover, the laser beam of the 400 nm or less wavelength can be easily reduced to such a minimum spot diameter or width as small as 100 μm or less on the transparent conductive layer member. This permits the formation of the transparent conductive layer with higher precision and more finely than in the past. Moreover, in the case of forming a plurality of such transparent conductive layers, they can be spaced apart such a small distance as 100 μm or less. Accordingly, the manufacturing method of the present invention provides a smaller and more compact electronic device having a plurality of transparent conductive layers than does the conventional method.

In accordance with another aspect of the present invention, a linear laser beam or beams, which are obtained by once diverging the laser beam from the laser beam source and then applying the diverged laser beam to a cylindrical lens or lenses, are used for irradiating the transparent conductive layer member. By preselecting the length of such a linear laser beam or beams greater than the width of the transparent conductive layer member and by moving the beam or beams incessantly or intermittently in a predetermined direction, a square, rectangular or strip-like transparent conductive layer can easily be obtained from the transparent conductive layer member in a short time.

Other objects, features and advantages of the present invention will become more fully apparent from the following detailed description taken in conjunction with the, accompanying drawings.

DESCRIPTION OF THE PREFERRED EMBODIMENTS

Figure 1A:
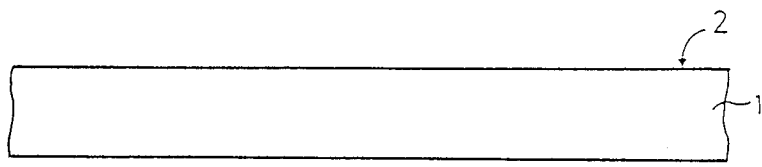
FIGS. 1A to H are schematic sectional views illustrating, by way of example, a sequence of steps involved in the manufacture of a semiconductor photoelectric conversion device having a plurality of semiconductor photoelectric conversion transducers according to the present invention.

Referring first to FIG. 1, the manufacture of a semiconductor photoelectric conversion device as the electronic device according to the present invention starts with the preparation of a substrate 1 (FIG. 1A).

The substrate 1 has a surface 2 of an organic or inorganic insulator. As such a substrate 1, for example, a synthetic resin substrate can be used which is transparent or nontransparent. It is also possible to employ a ceramic substrate, a transparent glass substrate, and a substrate which has an insulating film of synthetic resin, a silicon oxide, or the like, deposited on a stainless steel or metal plate.

Figure 1B:
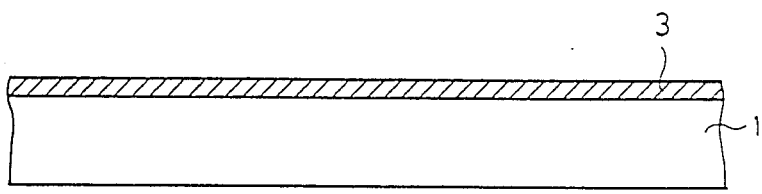

A conductive layer member 3 is formed on the substrate 1, by means of a known evaporation method or CVD method (FIG. 1B). The conductive layer member 3 has a thickness of 2 μm or less.

The conductive layer member 3 may be formed as a transparent conductive layer member. In this case, the substrate 1 is transparent. The transparent conductive layer member 3 is constituted principally of a sublimable metallic oxide such as $SnO_2$, $In_2O_3$ or ITO (Indium-Tin oxide), a sublimable metallic nonoxide material such as a Si—Cr or Si—Ni alloy, or a sublimable metallic nitride such as a SbN, InN or $Sn_5N_4$.

The conductive layer member 3 may also be formed as a nontransparent conductive layer. In such a case, the substrate 1 need not be transparent. The nontransparent conductive layer member 3 is constituted principally of a sublimable metal such as Cr, a Cr—Cu alloy (containing 0.1 to 50 Wt% of Cu), a Cr—Ag alloy (containing 0.1 to 50 wt % of Ag), or aCrN alloy (containing 0.1 to 50 wt % of N), or a nonsublimable metal such as Al, Cu, or Ag.

Further, the conductive layer member 3 may also be a laminate member which comprises a transparent conductive layer constituted principally of the abovesaid sublimable metallic oxide, sublimable metallic nonoxide, or sublimable metallic nitride, and a nontransparent conductive layer constituted principally of the abovesaid sublimable metal, or nonsublimable metal. In this case, the nontransparent conductive layer is formed on the side of the substrate 1, and the substrate 1 need not be transparent.

Figure 1C:
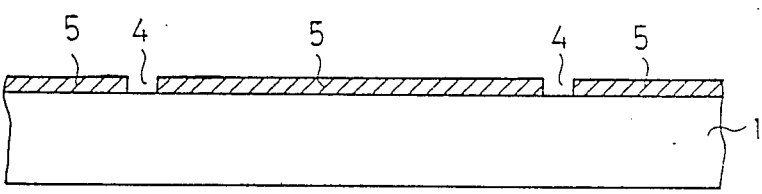

Next, the conductive layer member 3 is subjected to patterning by the use of one or more laser beams, forming a plurality of conductive layers 5 which are each isolated from adjacent ones by a groove 4 (FIG. 1C).

When the conductive layer member 3 is transparent, the laser beam or beams used are spot-shaped or linear laser beams which have a wavelength of 400 nm or less and optical energy (3.1 eV or more) greater than the optical energy band gap of the transparent conductive member 3.

Where the spot-shaped laser beam or beams are used, they have a 3 to 60 μm spot diameter in cross section on the transparent conductive layer member 3. The spot-shaped laser beam or beams may be pulsed laser beams that have a duration of 50 nano-seconds or less and frequency of 1 to 100 Hz.

As the spot-shaped pulsed laser beam or beams, it is possible to employ a pulsed laser beam or beams of a 193 nm or so (ArF), 248 nm or so (KrF), 308 nm or so (XeCl), or 315 nm or so (XeF) wavelength which is obtainable with an excimer laser, a laser beam of a 363 nm or so or 351 nm or so wavelength which is obtainable with an argon laser, or a laser beam of a 337 nm or so wavelength which is obtainable with a nitrogen laser.

When the linear pulsed laser beams are used, they can be created in such a manner as described below in conjunction with FIG. 5.

A square- or rectangular-sectioned pulsed laser beam of a small cross-sectional area, which is available from the aforesaid excimer, argon or nitrogen laser beam source 51, for example, a rectangular-sectioned pulsed laser beam 52 which measures 16×20 mm in cross section is applied to a beam magnifier 53 to obtain a pulse laser beam 54 which is similar in cross section to the laser beam 52 but has a larger cross-sectional area than the latter. In order words, the diverged pulsed laser beam 54 is obtained from the laser beam 52. Next, the pulsed laser beam 54 is applied via a reflector 55 to a cylindrical lens array 57 which has a plurality of cylindrical lenses 56 arranged in a common plane, by which are obtained a plurality of linear pulsed laser beams 57, for example, 30 cm long and 15 μm wide, which are converged on the transparent conductive layer member 13.

The conductive layer member 3 is transparent, and when the abovesaid spot-shaped or linear pulsed laser beam or beams having a wave length 400 nm or less are therefore used, since the stop-shaped or linear laser beam or beams have such a short wavelength of 400 nm or less, the absorption coefficient of the conductive layer member 3 for the laser beam is more than 100 times larger than the absorption coefficient for a laser team having a long wavelength of about 1060 nm which is obtainable with a YAG laser. Accordingly, the conductive layer member 3 is effectively heated by the laser beam locally at the position of its irradiation. On the other hand, since the conductive layer member 3 is as thin as 2 μm or less, it does not unnecessarily transfer therethrough heat resulting from the irradiation by the laser beam, namely, the heat generated in the layer member 3 does not unnecessarily escape therefrom to the outside through the layer member 3 itself. Moreover, the substrate 1 has the insulating surface, and hence it also prevents the heat generated in the conductive layer member 3 from unnecessarily escaping therefrom to the outside through the substrate 1. Accordingly, the material of the conductive layer member 3 is effectively sublimed at the position of irradiation by the laser beam. In this case, it is preferable that the scanning or irradiation of the transparent conductive layer member 3 by the above-said spot-shaped or linear pulsed laser beam or beams having a 400 nm or less wavelength be carried out under a diminished pressure of $10^{-5}$ torr or less. This ensures more effective sublimation of the material forming the transparent conductive layer member 3.

Figure 2A:
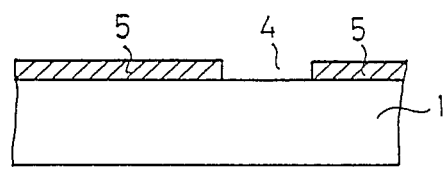
FIGS. 2A to D are schematic sectional views explanatory of conductive layer which is formed on a substrate the fabrication of the semiconductor photoelectric conversion device.
Figure 2B:
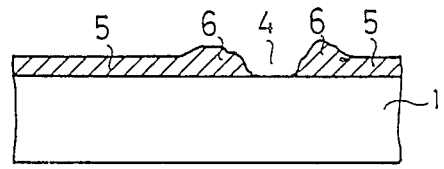
Figure 2C:
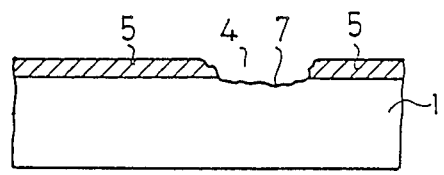
Figure 2D:
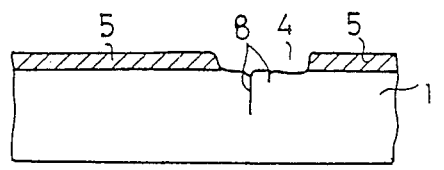

As a result of this, transparent conductive layers 5 are neatly formed, along with the grooves 4, as shown in FIG. 2A. In this case, there is no possibility that the material of the transparent conductive layers 5, molten by the laser beam irradiation, is deposited on the marginal edges of the transparent conductive layers 5, as indicated by 6, in FIG. 2B. Further, since the laser beam is effectively absorbed by the conductive layer member 3 because of its short wavelength, it does not inflict on the substrate unnecessary damages such as depressions and cracks as indicated by 7 and 8 in FIGS. 2C and D.

The effects described just above are prominent especially when the conductive layer member 3 is a transparent conductive layer member which is constituted principally of the aforementioned sublimable metallic oxide, sublimable metallic nitride or sublimable metallic nonoxide. Incidentally, even if the conductive layer member 3 is a nontransparent conductive layer which is constituted principally of the aforementioned nonsublimable metal, or a laminate member comprised of the abovesaid transparent conductive layer and the nontransparent conductive layer which is constituted mainly of the aforementioned nonsublimable metal,the same effect as mentioned above can be obtained through use of the spot-shaped or linear laser beam or beams of a 400 nm or less wavelength.

Figure 5:
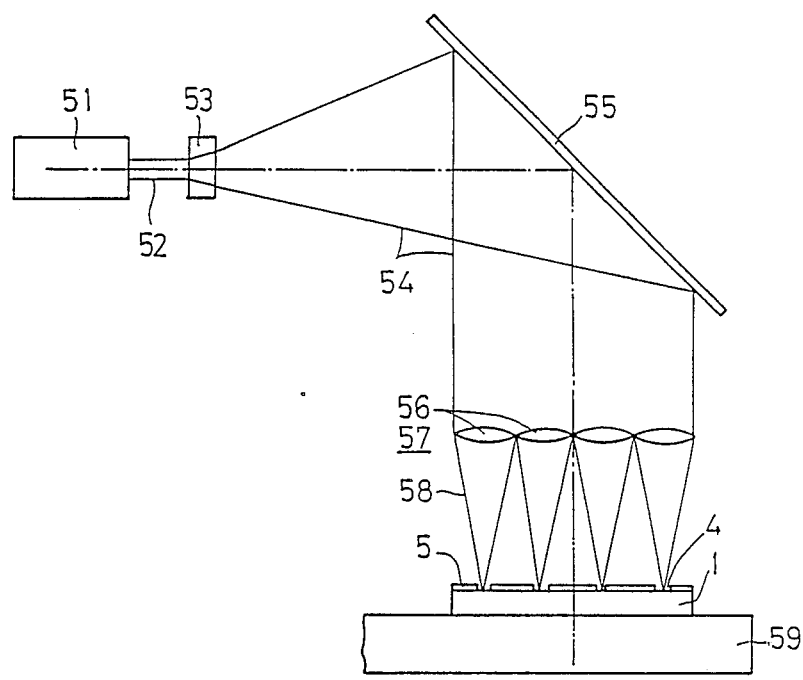
FIG. 5 is a schematic diagram showing how a transparent conductive layer is patterned by means of a plurality of linear laser beams into a plurality of transparent conductive layers.

FIG. 5 shows the case in which the transparent conductive layer member 3 formed on the substrate 1, which is mounted on a table 59, is patterned by four linear laser beams into five transparent conductive layers 5. In this case, a number of such transparent conductive layers 5 can also be easily obtained by moving the table 59 while scanning or irradiating the transparent conductive layer member 3 by the spot-shaped or linear laser beam or beams. In the case of FIG. 5, the table 59 need not be moved since five transparent conductive layers 5 are formed by using four laser beams as mentioned above.

Figure 1D:
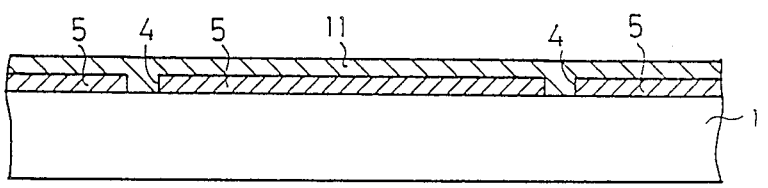

Next, a non-single-crystal semiconductor layer member 11 is formed, by a known CVD, low-pressure CVD, plasma or glow discharge CVD, or photo CVD method, on the substrate 1 so that it covers the conductive layers 5 and extends into the grooves 4 (FIG. 1D).

The non-single-crystal semiconductor layer member 11 has a thickness, for instance, of 2 μm or less.

The non-single-crystal semiconductor layer member 11 has a PN junction structure wherein a P-type non-single-crystal semiconductor layer and N-type non-single-crystal semiconductor layer are laminated one on the other in this order or in the reverse order, or a PIN junction structure wherein a P-, I- and N-type non-single-crystal semiconductor layers are laminated one on another in this order or in the reverse order.

The non-single-crystal semiconductor layer member 11 may be constituted mainly of a sublimable semiconductor material such as Si, $Si_xGe_{1-4}$ (where $0<X<0.5$), $Si_xC_{1-x}$ (where $0<X<1$), $Si_3N_{n-x}$ (where $0<X<2$) or $SiO_{2-x}$ (where $0<X<1$), and the layer 11 has introduced therein hydrogen or a halogen as a dangling bond neutralizer.

Figure 1E:
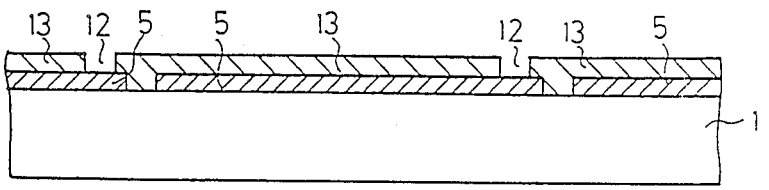

Next, the non-single-crystal semiconductor layer member 11 is subjected to patterning by one or more laser beams, forming a plurality of non-single-crystal semiconductor layers 13 each isolated from adjacent ones by a groove 12 (FIG. 1E).

In this case, the grooves 12 are each formed to expose each conductive layer 5 in the vicinity of each groove 4. Accordingly, each non-single-crystal semiconductor layer 13 extends on one conductive layer 5 and into the groove 4 and further onto the adjoining conductive layer 5 slightly.

The patterning of the non-single-crystal semiconductor layer member 11 may be effected using the same spot-shaped or linear laser beam or beams having a wavelength of 400 nm or less as those for the formation of the transparent conductive layers 5. Therefore, no detailed description will be repeated.

Figure 3A:
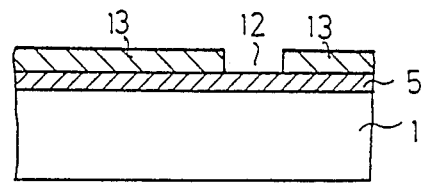
FIGS. 3A and B are schematic sectional views explanatory of a non-single-crystal semiconductor layer which is formed on the conductive layer in the fabrication of the semiconductor photoelectric conversion device.
Figure 3B:
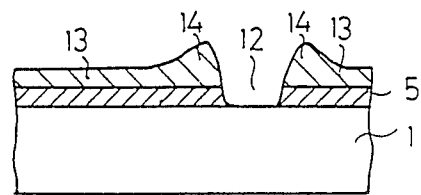

In the case where the spot-shaped or linear laser beam or beams having a wavelength 400 nm or less are used, the absorption coefficient of the non-single-crystal semiconductor layer 11 for the laser beam or beams isalso large as is the case with the aforementioned conductive layer member 3, because the laser beam used has such a short wavelength as 400 nm or less. Therefore, the non-single-crystal semiconductor layer member 11 is effectively heated at the position of irradiation by the laser beam as in the case of the aforementioned conductive layer member 3. Further, since the non-single-crystal semiconductor layer member 11 is as thin as 2 μm or less, it does not transfer laterally therethrough the heat generated therein, thereby preventing the heat from unnecessarily escaping from the layer member 11 to the outside, as described previously. Moreover, in the case where the non-single-crystal semiconductor layer member 11 is constituted principally of the sublimable semiconductor, as referred to previously. the non-single-crystal semiconductor layers 13 can be formed neatly, along with the grooves 12, as shown in FIG. 3A, and it is possible to prevent the material of each non-single-crystal semiconductor layer 13, molten by the laser beam irradiation, from being deposited on its marginal edge, as indicated by 14 in FIG. 3B, and the conductive layer 5 from being hollowed, by the laser beam, thereby avoiding the formation therein of a deep depression which may sometimes reach the substrate 1, as indicated by 15 in FIG. 3B.

Figure 1F:
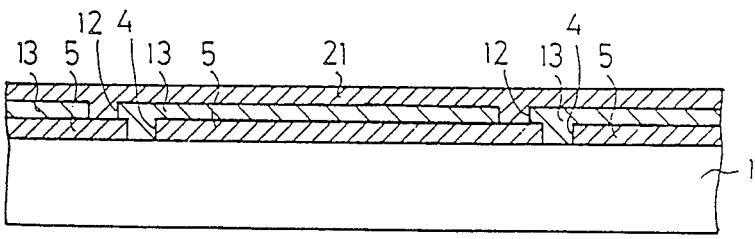

Next, a conductive layer member 21, which covers the non-single-crystal semiconductor layers 13 and extends into the grooves 12, is formed on the substrate 1 by the same method as that for the formation of the conductive layer 3 (FIG. 1F).

The conductive layer member 21 has a thickness of 2 μm or less.

The conductive layer member 21 may be formed as a transparent conductive layer which is constituted principally of the sublimable metallic oxide, sublimable metallic nitride, or sublimable metallic nonoxide material mentioned previously with regard to the conductive layer 3. In this case, the substrate 1 need not be transparent.

The conductive layer member 21 may also be formed as a nontransparent conductive layer which is constituted principally of the aforesaid sublimable metal. In such a case, the substrate 1 is transparent.

Moreover, the conductive layer member 21 may also be formed as a laminate member which composed of a transparent conductive layer constituted mainly of the aforesaid sublimable metallic oxide, or sublimable metallic nonoxide material and a nontransparent conductive layer which is constituted mainly of the aforementioned sublimable or nonsublimable metal. In this case, the transparent conductive layer is formed on the side of the non-single-crystal semiconductor layer 13, and the substrate 1 is transparent.

Figure 1G:
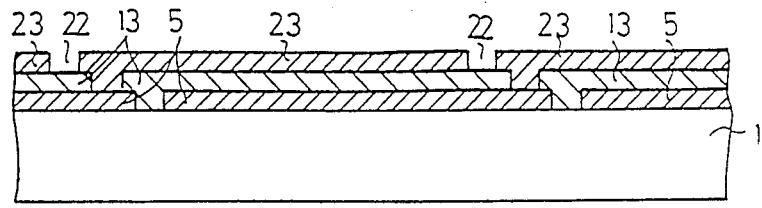
Figure 1H:
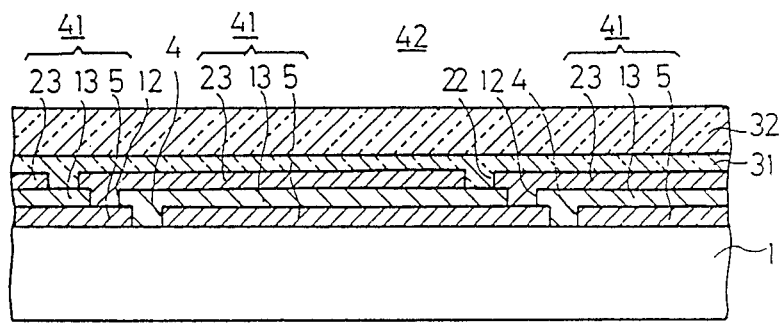

Next, the conductive layer member 21 is subjected to patterning by one or more laser beams, forming a plurality of conductive layers 23 which are each isolated from adjacent ones by a groove 22 (FIG. 1G).

In this case, the grooves 22 are each formed to expose one of the non-single-crystal semiconductor layers 13 in the vicinity of one of the grooves 12. Accordingly, each conductive layer 23 extends on one of the non-single-crystal semiconductor layers 13 and down into one of the grooves 12, wherein it is connected to the underlying conductive layer 5, and it further extends slightly onto the adjoining non-single-crystal semiconductor layer 13.

The laser beam used for the patterning of the conductive layer member 21 into the conductive layers 23 may be the same spot-shaped or linear pulsed laser beam or beams having a wavelength of 400 nm or less as those for the formation of the transparent conductive layers 5. Therefore, no detailed description will be repeated.

Figure 4A:
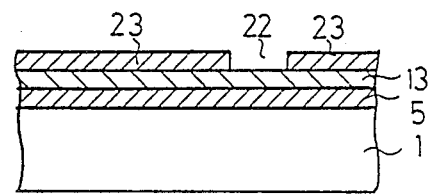
FIGS. 4A to C are schematic sectional views explanatory of a conductive layer which is formed on the non-single-crystal semiconductor layer in the fabrication of the semiconductor photoelectric conversion device.
Figure 4B:
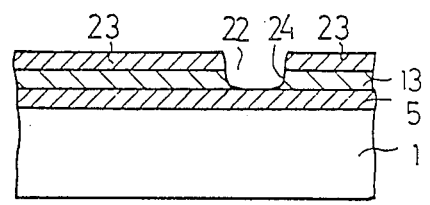
Figure 4C:
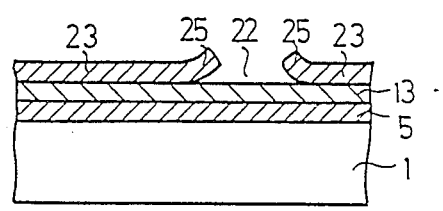

In the case where the conductive layer member 21 is transparent and the spot-shaped or linear laser beam or beams having 400 nm or less wavelength are used therefore, the absorption coefficient of the conductive layer member 21 for such a laser beam or beams are large as described previously in connection with the formation of the transparent conductive layers 5. On the other hand, the conductive layer member 21 is thin and its portion on the side of the non-single-crystal semiconductor layer 13 is constituted mainly of the sublimable metallic oxide, sublimable metallic nitride, sublimable metallic nonoxide, or sublimable metal, so that the conductive layers 23 are neatly formed, along with the grooves 22. That is to say, there is no possibility that the underlying non-single-crystal semiconductor layers 13 are hollowed, by the laser beam, to form therein deep depressions which may sometimes reach the underlying conductive layers 5, as indicated by 24 in FIG. 4B, and that the conductive layers 23 are exfoliated at their marginal edges, as indicated by 25 in FIG. 4C.

Next, a passivation film 31 as of silicon nitride, which covers the conductive layers 23 and extends into the grooves 22, is formed by, for instance, a known plasma CVD method, and a protective film 32 of a synthetic resin is formed on the passivation film 31.

In such a manner as described above, a semiconductor photoelectric conversion device 42 is fabricated in which a plurality of semiconductor photoelectric transducers 41, each comprising the conductive layer 5, the non-single-crystal semiconductor layer 13 and the conductive layer 23, are connected in series through the portions of the conductive layers 23 extending into the grooves 12.

With the manufacturing method of the present invention described above, the conductive layer 5, the non-single-crystal semiconductor layer 13 and the conductive layer 23, which make up each semiconductor photoelectric transducer 41, can be easily formed with high accuracy and finely, without damaging them or exfoliating their marginal edges and without cracking the substrate 1.

Further, the respective layers of each semiconductor photoelectric transducer 41 are isolated from the layers of the adjoining transducer 41 by a groove of a width substantially equal to the diameter or width of the laser beam, which is as small as 3 to 60 μm, so that a semiconductor photoelectric conversion device 42 can easily be manufactured in which a plurality of semiconductor photoelectric transducers 41 are arranged with a high density While in the foregoing present invention has been described as being applied to the manufacture of a semiconductor photoelectric conversion device, it will be apparent that the invention is also applicable to the manufacture of various semiconductor devices each of which has at least a transparent conductive layer.

Further, although the foregoing description has been given of the case of cutting a transparent conductive layer member by a linear laser beam or beams into a plurality of transparent conductive layers which are each separated from adjacent ones by a groove of substantially the same width as that of the laser beam or beams, it is also possible to form a narrower transparent conductive layer by moving the linear laser beam in a direction, for instance, perpendicular to its lengthwise direction to remove the transparent conductive layer member over a width larger than that of the linear laser beam.

It will be apparent that many modifications and variations may be effected without departing from the scope of the novel concepts of the present invention.

What is claimed is:

1. A laser scribing method for producing a plurality of grooves on a semiconductor layer comprising:
   expanding laser light emitted from an eximer laser with respect to the cross-section of the laser light;
   contracting the expanded laser light in only one direction by a convex lens;
   focusing the contracted laser light on said semiconductor layer; and
   subliming a part of said semiconductor layer
   wherein said convex lense is the lense nearest the semiconductor layer forming a focal point where said subliming takes place.

2. A laser scribing method as defined in claim 1 wherein said semiconductor layer is an element of a solar cell.

3. A laser scribing method as defined in claim 2 wherein said solar cell is formed with a plurality of photoconversion devices which are severed by said laser scribing and connected with each other in series.

4. A laser scribing method as defined in claim 3 further comprising, between said expanding step and said contracting step, a step of bending said expanded laser beam by reflection at a mirror.

5. A laser scribing method as defined in claim 1, wherein said convex lense is a cylindrical convex lense.

6. A laser scribing method for producing a plurality of grooves on a semiconductor layer comprising:
   expanding laser light emitted from an eximer laser with respect to the cross-section of the laser light;
   reflecting the expanding laser light on a mirror;
   contracting the reflected laser light in only one direction by means of a convex lens;
   focusing the contracted laser light on said semiconductor layer; and
   subliming a part of said semiconductor layer
   wherein said convex lense is the lense nearest the semiconductor layer forming a focal point where said subliming takes place.

7. A laser scribing method as defined in claim 6, wherein said convex lense is a cylindrical convex lense.

8. A laser scribing method for producing a plurality of grooves on a semiconductor layer comprising:
   expanding laser light emitted from an eximer laser with respect to the cross-section of the laser light;
   contracting the expanded laser light in only one direction by means of a plurality of convex lenses; and
   focusing the contracted laser light on said semiconductor layer,
   wherein said expanded laser light is separated into a plurality of laser rays by said plurality of convex lenses and said contracing and focusing is performed by each of said convex lenses to produce a plurality of laser rays having a linear cross-section, said plurality of convex lenses being the lenses nearest the semiconductor layer with each laser ray respectively forming a focal point for subliming a line on said semiconductor layer to produce said plurality of grooves.

9. A laser scribing method as defined in claim 8, wherein said plurality of convex lenses are cylindrical convex lenses.

* * * * *